United States Patent
Chang et al.

(10) Patent No.: US 12,265,336 B2
(45) Date of Patent: Apr. 1, 2025

(54) SEMICONDUCTOR PROCESSING TOOL AND METHODS OF OPERATION

(71) Applicant: Taiwan Semiconductor Manufacturing Company, Ltd., Hsinchu (TW)

(72) Inventors: Kai-Chieh Chang, Changhua (TW); Che-Chang Hsu, Taichung (TW); Yen-Shuo Su, Hsinchu (TW); Chun-Lin Chang, Zhubei (TW); Kai-Fa Ho, New Taipei (TW); Li-Jui Chen, Hsinchu (TW); Heng-Hsin Liu, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 694 days.

(21) Appl. No.: 17/446,241

(22) Filed: Aug. 27, 2021

(65) Prior Publication Data

US 2022/0350264 A1   Nov. 3, 2022

Related U.S. Application Data

(60) Provisional application No. 63/201,462, filed on Apr. 30, 2021.

(51) Int. Cl.
*G03F 7/00* (2006.01)
*G02B 5/08* (2006.01)

(52) U.S. Cl.
CPC ....... *G03F 7/70916* (2013.01); *G02B 5/0891* (2013.01); *G03F 7/70033* (2013.01); *G03F 7/70933* (2013.01)

(58) Field of Classification Search
CPC ............. G03F 7/70916; G03F 7/70033; G03F 7/70933; G03F 7/70925; G02B 5/0891
(Continued)

(56) References Cited

U.S. PATENT DOCUMENTS

2005/0110966 A1* 5/2005 Hasegawa ........... G03F 7/70891
355/53
2007/0211850 A1* 9/2007 Lambert ............. G03F 7/70925
134/1
(Continued)

FOREIGN PATENT DOCUMENTS

JP    2011129800 A  *  6/2011

OTHER PUBLICATIONS

The translation of JP 2011129800 A, Jun. 30, 2011, Exposure Apparatus, Surface Treatment Method, and Device Manufacturing Method.*

*Primary Examiner* — Kiet T Nguyen
(74) *Attorney, Agent, or Firm* — Harrity & Harrity, LLP

(57) ABSTRACT

An exposure tool is configured to remove contaminants and/or prevent contamination of mirrors and/or other optical components included in the exposure tool. In some implementations, the exposure tool is configured to flush and/or otherwise remove contaminants from an illuminator, a projection optics box, and/or one or more other subsystems of the exposure tool using a heated gas such as ozone ($O_3$) or extra clean dry air (XCDA), among other examples. In some implementations, the exposure tool is configured to provide a gas curtain (or gas wall) that includes hydrogen ($H_2$) or another type of gas to reduce the likelihood of contaminants reaching the mirrors included in the exposure tool. In this way, the mirrors and one or more other components of the exposure tool are cleaned and maintained in a clean environment in which radiation absorbing contaminants are controlled to increase the performance of the exposure tool.

20 Claims, 11 Drawing Sheets

(58) Field of Classification Search
USPC .................................................... 250/492.2
See application file for complete search history.

(56) References Cited

U.S. PATENT DOCUMENTS

2009/0014666 A1* 1/2009 Zink .................. G03F 7/70925
                                                                     134/1
2011/0261329 A1* 10/2011 Schimmel ........... G03F 7/70908
                                                                    73/40.7

* cited by examiner

SEMICONDUCTOR PROCESSING TOOL AND METHODS OF OPERATION

CROSS-REFERENCE TO RELATED APPLICATION

This Patent Application claims priority to U.S. Provisional Patent Application No. 63/201,462, filed on Apr. 30, 2021, and entitled "SEMICONDUCTOR PROCESSING TOOL AND METHODS OF OPERATION." The disclosure of the prior Application is considered part of and is incorporated by reference into this Patent Application.

BACKGROUND

As semiconductor device sizes continue to shrink, some lithography technologies suffer from optical restrictions, which lead to resolution issues and reduced lithography performance. In comparison, extreme ultraviolet (EUV) lithography can achieve much smaller semiconductor device sizes and/or feature sizes through the use of reflective optics and radiation wavelengths of approximately 13.5 nanometers or less.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
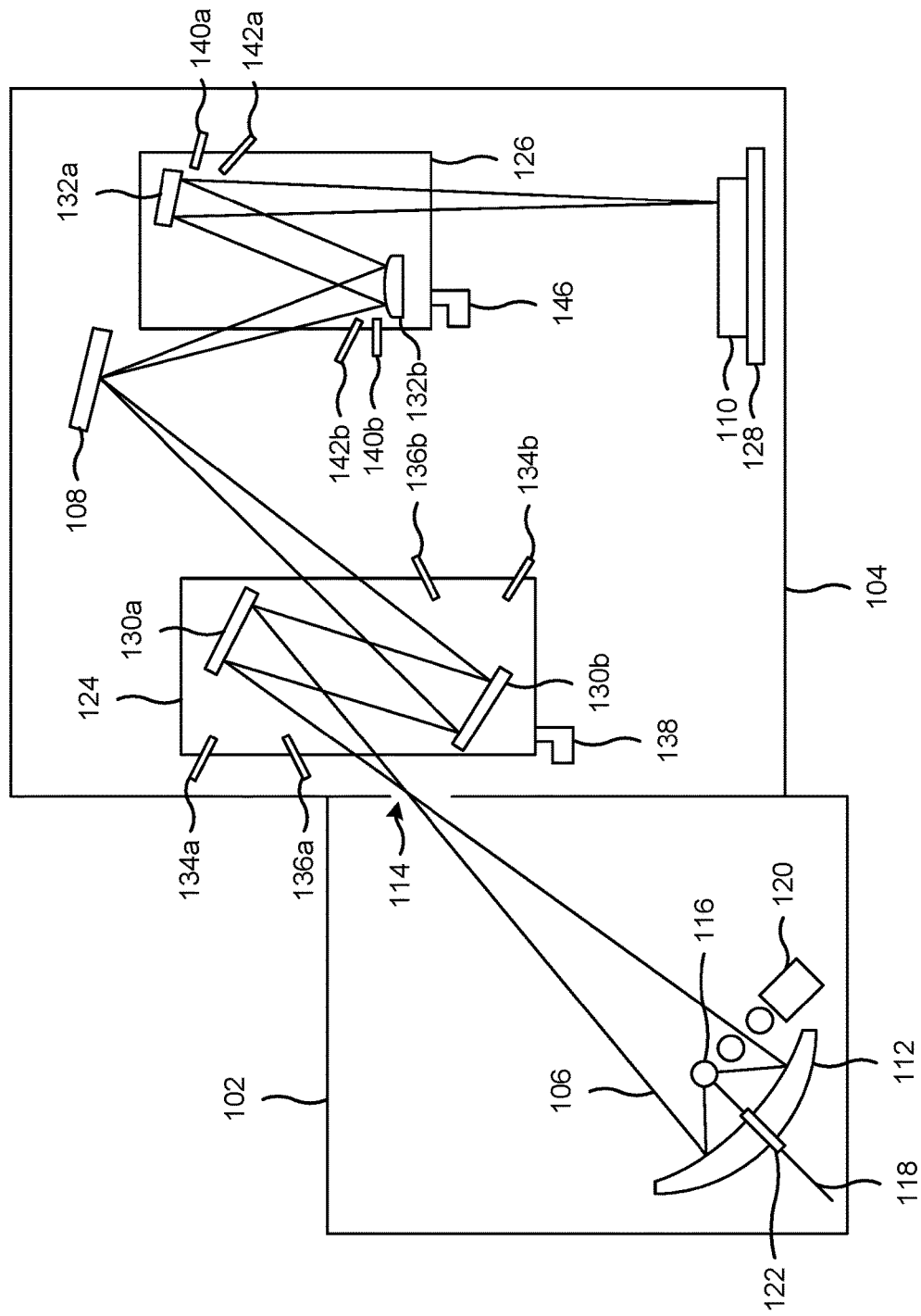
FIG. 1 is a diagram of an example lithography system described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

One of the challenges with extreme ultraviolet (EUV) lithography is that EUV radiation is highly absorbed by most matter due to the short wavelength of EUV radiation. As a result, only a small fraction of EUV radiation that is generated by an EUV source is finally available at a substrate that is to be patterned. Contamination of the optical components of an EUV exposure tool (e.g., illuminator mirrors, projection optics box (POB) mirrors) caused by tin, carbon, and/or another type of particle may increase the absorption of EUV radiation by the optical components, thereby further reducing the performance of the EUV exposure tool.

Some implementations described herein provide an exposure tool (such as an EUV exposure tool or another type of semiconductor exposure tool) that is configured to remove contaminants and/or prevent contamination of mirrors and/or other optical components included in the exposure tool. In some implementations, the exposure tool is configured to flush and/or otherwise remove contaminants from an illuminator, a projection optics box, and/or one or more other subsystems of the exposure tool using a heated gas such as ozone ($O_3$) or extra clean dry air (XCDA), among other examples. In some implementations, the exposure tool is configured to provide a gas curtain (or gas wall) that includes hydrogen ($H_2$) or another type of gas to reduce the likelihood of contaminants reaching the mirrors included in the exposure tool. In this way, the mirrors and one or more other components of the exposure tool are cleaned and maintained in a clean environment in which radiation (e.g., EUV radiation or another type of electromagnetic radiation) absorbing contaminants are controlled to increase the performance of the exposure tool.

FIG. 1 is a diagram of an example lithography system 100 described herein. The lithography system 100 includes an EUV lithography system or another type of lithography system that is configured to transfer a pattern to a semiconductor substrate using mirror-based optics.

As shown in FIG. 1, the lithography system 100 includes a radiation source 102 and an exposure tool 104. The radiation source 102 (e.g., an EUV radiation source or another type of radiation source) is configured to generate radiation 106 such as EUV radiation and/or another type of electromagnetic radiation (e.g., light). The exposure tool 104 (e.g., an EUV exposure tool or another type of exposure tool) is configured to focus the radiation 106 onto a reflective reticle 108 (or a photomask) such that a pattern is transferred from the reticle 108 onto a semiconductor substrate 110 using the radiation 106.

The radiation source 102 includes a collector 112, which includes a curved mirror that is configured to collect the radiation 106 generated by the radiation source 102 and to focus the radiation 106 toward an intermediate focus 114. The radiation 106 is produced from a plasma that is generated from droplets 116 (e.g., tin (Sn) droplets or another type of droplets) being exposed to a laser 118. The droplets 116 are provided across the front of the collector 112 by a droplet generator (DG) head 120. The DG head 120 is pressurized to provide a fine and controlled output of the droplets 116. The laser 118 is provided through an opening 122 such that the plasma is generated in front of the collector 112. The laser 118 is pulsed at a timing that is synchronized with the flow of the droplets 116 from the DG head 120.

The exposure tool 104 includes an illuminator 124 and a projection optics box (POB) 126. The projection optics box 126 includes a plurality of mirrors that are configured to project the radiation 106 onto the semiconductor substrate 110 after the radiation 106 is modified based on the pattern of the reticle 108. The exposure tool 104 includes a stage 128 (e.g., a wafer stage) configured to support the semiconductor substrate 110. Moreover, the stage 128 is configured to move (or step) the semiconductor substrate 110 through a plurality of exposure fields as the radiation 106 transfers the pattern from the reticle 108 onto the semiconductor substrate 110.

The illuminator 124 includes a plurality of reflective mirrors that are configured to focus and/or direct the radiation 106 onto the reticle 108 so as to illuminate the pattern on the reticle 108. The illuminator 124 includes a mirror 130a, a mirror 130b, and/or one or more other mirrors such as a relay mirror and/or another type of mirror. The mirror 130a includes a field facet mirror (FFM) or another type of mirror that includes a plurality of facets. The mirror 130b includes a pupil facet mirror (PFM) or another type of mirror that also includes a plurality of facets. The facets of the mirrors 130a and 130b are arranged to tune the radiation 106 from the radiation source 102 to increase the uniformity of the radiation 106.

The projection optics box 126 includes a plurality of reflective mirrors such as the mirror 132a and 132b. In some implementations, the mirrors 132a and 132b are configured to focus or reduce the radiation 106 into an exposure field, which may include one or more die areas on the semiconductor substrate 110.

In an example exposure operation (e.g., an EUV exposure operation), the DG head 120 provides the stream of droplets 116 across the front of the collector 112. The laser 118 contacts the droplets 116, which causes a plasma to be generated. The plasma emits or produces radiation 106 (e.g., light). The radiation 106 may include EUV radiation having a wavelength of approximately 13.5 nanometers or less. The radiation 106 is collected by the collector 112 and directed out of the radiation source 102 and into the exposure tool 104 toward the mirror 130a of the illuminator 124. The mirror 130a reflects the radiation 106 onto the mirror 130b, which reflects the radiation 106 onto the reticle 108. The radiation 106 is modified by the pattern in the reticle 108. In other words, the radiation 106 reflects off of the reticle 108 based on the pattern of the reticle 108. The reticle 108 directs the radiation 106 toward the mirror 132b in the projection optics box 126, which reflects the radiation 106 onto the mirror 132a. The mirror 132a reflects the radiation 106 onto the semiconductor substrate 110 such that the pattern of the reticle 108 is transferred to the semiconductor substrate 110. The above-described exposure operation is an example, and the lithography system 100 may operate according to other EUV techniques and radiation paths that include a greater quantity of mirrors, a lesser quantity of mirrors, and/or a different configuration of mirrors.

As further shown in FIG. 1, the exposure tool 104 includes a plurality of components that are configured to remove and/or prevent (or reduce the likelihood of) contamination of the mirrors 130a, 130b, 132a, and 132b. This may reduce radiation decay of the mirrors 130a, 130b, 132a, and 132b and/or may increase the reflectivity of the mirrors 130a, 130b, 132a, and 132b, which may increase the efficiency and/or performance of the exposure tool 104. In particular, this may reduce the amount of the radiation 106 that is absorbed by the mirrors 130a, 130b, 132a, and 132b, which increases the intensity of the radiation 106 provided to the semiconductor substrate 110 on the stage 128.

The plurality of components include a plurality of gas inlets that are configured to provide one or more types of gasses into the exposure tool 104 and a plurality of pumps that are configured to pump, evacuate, and/or otherwise remove byproduct gasses from the exposure tool 104. A subset of the gas inlets and a subset of the pumps may be included in the illuminator 124. Another subset of the gas inlets and another subset of the pumps may be included in the projection optics box 126.

In particular, the illuminator 124 includes gas inlets 134a, 134b, 136a and 136b. The gas inlet 134a is configured to provide a flow of a first gas across the mirror 130a (e.g., across the front of the mirror 130a). The flow of the first gas functions as a gas curtain or a gas wall that blocks and/or otherwise is configured to prevent contaminants such as tin (Sn) and carbon (C) from reaching and landing on the mirror 130a. Similarly, the gas inlet 134b is configured to provide a flow of the first gas across the mirror 130b (e.g., across the front of the mirror 130b). The flow of the first gas functions as a gas curtain or a gas wall that blocks and/or otherwise is configured to prevent contaminants such as tin (Sn) and carbon (C) from reaching and landing on the mirror 130b.

The gas inlet 136a is configured to provide a flow of a second gas onto the front of the mirror 130a to remove contaminants such as carbon (C) from the mirror 130a. Similarly, the gas inlet 136b is configured to provide a flow of the second gas onto the front of the mirror 130a to remove contaminants such as carbon (C) from the mirror 130b.

The projection optics box 126 includes gas inlets 140a, 140b, 142a, and 142b. The gas inlet 140a is configured to provide a flow of the first gas across the mirror 132a (e.g., across the front of the mirror 132a). The flow of the first gas functions as a gas curtain or a gas wall that blocks and/or otherwise is configured to prevent contaminants such as tin (Sn) and carbon (C) from reaching and landing on the mirror 132a. Similarly, the gas inlet 140b is configured to provide a flow of the first gas across the mirror 132b (e.g., across the front of the mirror 132b). The flow of the first gas functions as a gas curtain or a gas wall that blocks and/or otherwise is configured to prevent contaminants such as tin (Sn) and carbon (C) from reaching and landing on the mirror 130b.

The gas inlet 142a is configured to provide a flow of the second gas onto the front of the mirror 132a to remove contaminants such as carbon (C) from the mirror 132a. Similarly, the gas inlet 142b is configured to provide a flow of the second gas onto the front of the mirror 132a to remove contaminants such as carbon (C) from the mirror 132b.

The illuminator 124 includes a pump 138 (e.g., a vacuum pump, a servo pump, and/or another type of pump) and the projection optics box 126 includes a pump 146 (e.g., a vacuum pump, a servo pump, and/or another type of pump). Contaminants and/or byproduct gasses result from reactions between contaminants and the flows of the gasses provided by the gas inlets included in the illuminator 124 and the projection optics box 126. Accordingly, the pump 138 is configured to pump, evacuate, and/or otherwise remove the contaminants and/or byproduct gasses from the illuminator 124. Similarly, the pump 146 is configured to pump, evacuate, and/or otherwise remove the contaminants and/or byproduct gasses from the projection optics box 126.

As indicated above, FIG. 1 is provided as an example. Other examples may differ from what is described with regard to FIG. 1.

Figure 2:
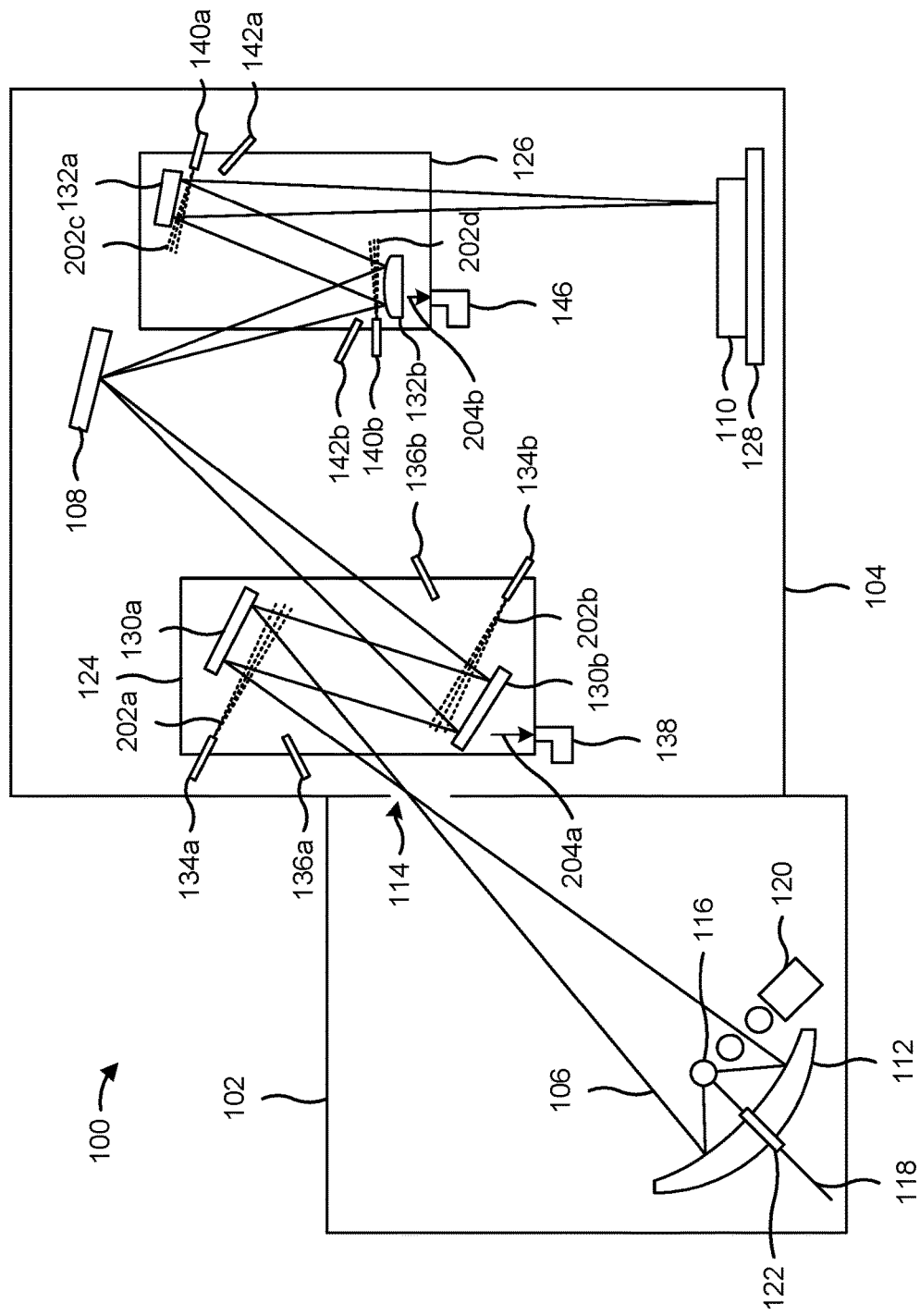
FIGS. 2 and 3 are diagrams of example implementations described herein.

FIG. 2 is a diagram of an example implementation 200 described herein. The example implementation 200 includes an example exposure operation in which the lithography system 100 exposes the semiconductor substrate 110 to the radiation 106 to transfer a pattern from the reticle 108 to the semiconductor substrate 110. Moreover, the example implementation 200 includes an example in which the gas inlets 134a, 134b, 140a, and 140b are used to provide a flow of a first gas (e.g., a gas curtain or gas wall) across the front of the mirrors 130a, 130b, 132a, and 132b, respectively, to prevent, reduce, and/or otherwise reduce the likelihood of contaminants in the lithography system 100 from reaching (and causing a contaminant buildup on) the mirrors 130a, 130b, 132a, and 132b during the exposure operation.

As shown in FIG. 2, the lithography system 100 performs an exposure operation to expose the semiconductor substrate 110 to the radiation 106 to transfer a patten from the reticle 108 to the semiconductor substrate 110. An example EUV exposure operation is described in connection with FIG. 1.

During the exposure operation, the gas inlet 134a provides a flow 202a of the first gas into the illuminator 124 and across the mirror 130a (e.g., across the front of the mirror 130a). The gas inlet 134b provides a flow 202b of the first gas into the illuminator 124 and across the mirror 130b (e.g., across the front of the mirror 130b). The gas inlet 140a provides a flow 202c of the first gas into the projection optics box 126 and across the mirror 132a (e.g., across the front of the mirror 132a). The gas inlet 140b provides a flow 202d of the first gas into the projection optics box 126 and across the mirror 132b (e.g., across the front of the mirror 132b).

The flows 202a, 202b, 202c, and 202d of the first gas may be initiated and/or generated prior to the start of the exposure operation. In this way, the gas inlets 134a, 134b, 140a, and 140b may be checked for proper operation and/or malfunctions. The first gas includes hydrogen ($H_2$) or another suitable gas that absorbs a minimal amount of the radiation 106 (e.g., EUV radiation) during the exposure operation. The flows 202a, 202b, 202c, and 202d of the first gas collect contaminants such as carbon (C) and tin (Sn), among other examples, before the contaminants reach and/or land on the mirrors 130a, 130b, 132a, and 132b during the exposure operation. Byproduct gasses 204a and 204b (which may include a combination of the first gas and the contaminants collected by the first gas) are pumped out of and/or removed from the illuminator 124 and the projection optics box 126, respectively, and out of the exposure tool 104. The gas inlets 134a, 134b, 140a, and 140b may provide the flows 202a, 202b, 202c, and 202d, respectively at a flow rate that is in a range of approximately 10 standard cubic centimeters per minute (SCCM) to approximately 300 SCCM to provide sufficient contaminant blocking and/or removal performance without unduly increasing the loading on the pumps 138 and 146.

As indicated above, FIG. 2 is provided as an example. Other examples may differ from what is described with regard to FIG. 2.

Figure 3:
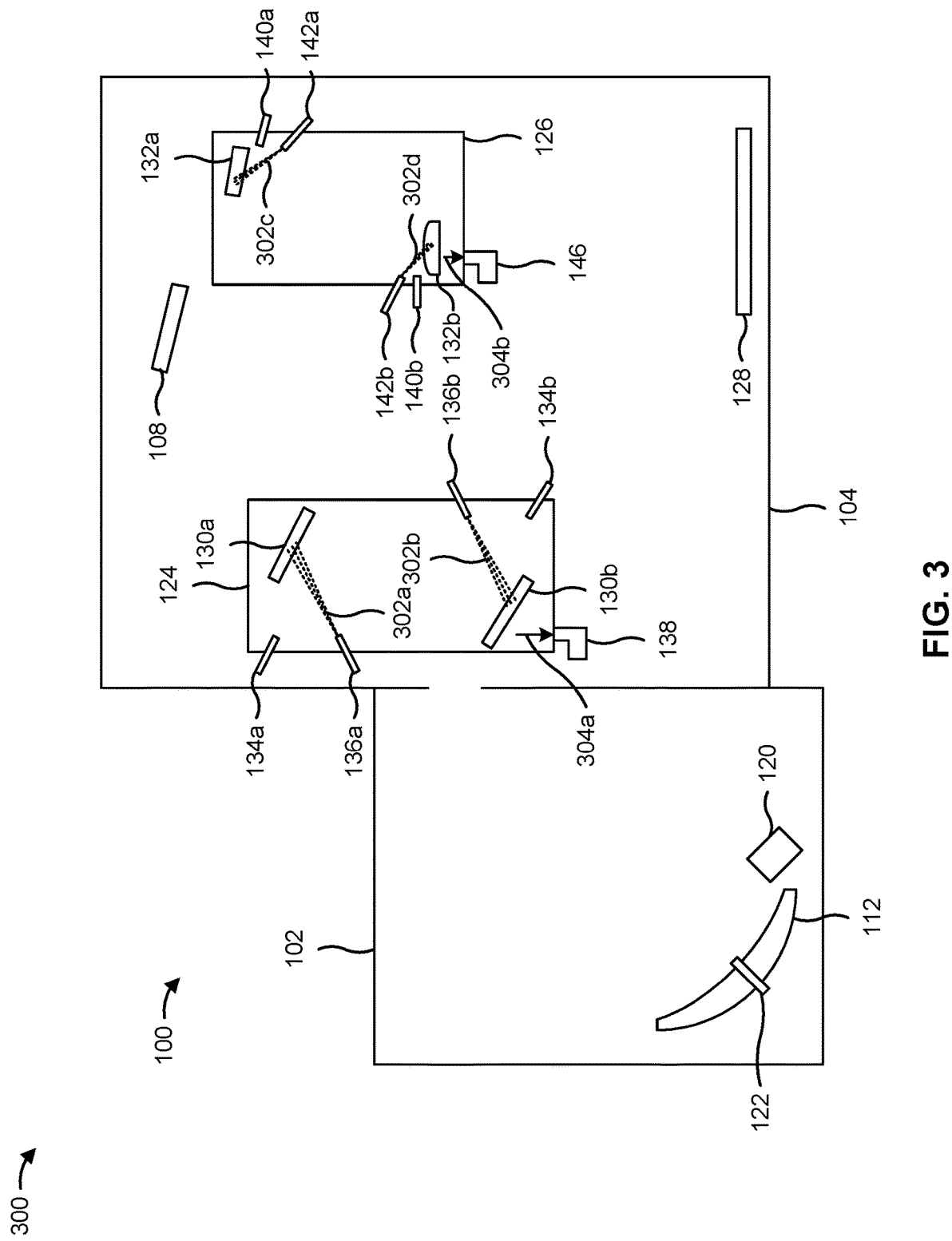

FIG. 3 is a diagram of an example implementation 300 described herein. The example implementation 300 includes an example cleaning operation in which optical components of the exposure tool 104 are cleaned while the lithography system 100 is offline, between exposure operations, and/or otherwise idle. While the lithography system 100 is not performing an exposure operation (e.g., during downtime of the lithography system 100, prior to an exposure operation, and/or after an exposure operation), the gas inlets 136a, 136b, 142a, and 142b are operated to clean and/or otherwise remove contaminants from the mirrors 130a, 130b, 132a, and 132b, respectively. In this way, the mirrors 130a, 130b, 132a, and 132b may be cleaned without reducing the performance of the exposure tool 104, which might otherwise be caused by radiation absorption of the gas that is used to clean the mirrors 130a, 130b, 132a, and 132b. Moreover, cleaning the mirrors 130a, 130b, 132a, and 132b using the gas inlets 136a, 136b, 142a, and 142b, respectively, decreases the reflectivity decay of the exposure tool 104 by reducing the amount of radiation 106 that is absorbed by contaminants on the mirrors 130a, 130b, 132a, and 132b.

As shown in FIG. 3, the gas inlets 136a, 136b, 142a, and 142b provide flows of a gas into the exposure tool 104 to clean the mirrors 130a, 130b, 132a, and 132b, respectively. In particular, the gas inlet 136a provides a flow 302a of a gas into the illuminator 124 and onto the mirror 130a to clean the mirror 130a. The gas inlet 136b provides a flow 302b of a gas into the illuminator 124 and onto the mirror 130b to clean the mirror 130b. The gas inlet 142a provides a flow 302c of a gas into the projection optics box 126 and onto the mirror 132a to clean the mirror 132a. The gas inlet 142b provides a flow 302d of a gas into the projection optics box 126 and onto the mirror 132b to clean the mirror 132b.

The gas includes a heated gas to increase the effectiveness of cleaning the mirrors 130a, 130b, 132a, and 132b and to facilitate a reaction between the gas and the contaminants on the mirrors 130a, 130b, 132a, and 132b. The gas includes a heated ozone ($O_3$), a heated extra clean dry air (XCDA), and/or another suitable heated gas that is capable of removing carbon (C) (or another contaminant) from the mirrors 130a, 130b, 132a, and 132b. The gas may be heated to a temperature in a range of approximately 50 degrees Celsius to approximately 90 degrees Celsius to increase the speed of the reaction between the gas and the contaminants while minimizing potential damage to the coating(s) on the mirrors 130a, 130b, 132a, and 132b.

The reaction between the flows 302a, 302b, 302c, and 302d of the gas and the contaminants on the mirrors 130a, 130b, 132a, and 132b, respectively, results in the formation of byproduct gasses in the illuminator 124 and in the projection optics box 126. The byproduct gasses are formed due to the removal of contaminants from the mirrors 130a, 130b, 132a, and 132b by the gas. In particular, the flow 302a of the gas reacts with the contaminants on the mirror 130a, and the flow 302b of the gas reacts with the contaminants on the mirror 130b, which results in the formation of byproduct gasses 304a in the illuminator 124. Similarly, the flow 302c of the gas reacts with the contaminants on the mirror 132a, and the flow 302d of the gas reacts with the contaminants on the mirror 132b, which results in the formation of byproduct gasses 304b in the projection optics box 126. An example reaction includes $$C + 2O_3 \rightarrow CO_2 + 2O_2$$

in which carbon (C) contaminants on the mirrors 130a, 130b, 132a, and 132b and ozone ($O_3$) of the gas react to form the byproduct gasses carbon dioxide ($CO_2$) and oxygen ($O_2$).

As further shown in FIG. 3, the pump 138 pumps out and/or otherwise removes the byproduct gasses 304a from the illuminator 124. Similarly, the pump 146 pumps out and/or otherwise removes the byproduct gasses 304b from the projection optics box 126. In some implementations, the pumps 138 and 146 remove the byproduct gasses 304a and 304b from the exposure tool 104.

In some implementations, the mirrors 130a, 130b, 132a, and 132b are cleaned using the flows 302a, 302b, 302c, and 302d, respectively, based on a cleaning schedule associated with the exposure tool 104. As an example, the exposure tool 104 may be configured or scheduled to perform cleaning of the mirrors 130a, 130b, 132a, and 132b using the flows 302a, 302b, 302c, and 302d, respectively, on a particular day, at a particular time interval (e.g., once a week, once a month), at the end of a particular wafer lot, and/or based on another schedule. In some implementations, the mirrors 130a, 130b, 132a, and 132b are cleaned using the flows 302a, 302b, 302c, and 302d, respectively, based on an amount of contaminant buildup on the mirrors 130a, 130b, 132a, and 132b (e.g., as determined using sensors). In some implementations, the mirrors 130a, 130b, 132a, and 132b are cleaned using the flows 302a, 302b, 302c, and 302d, respectively, during a depressurization in which the exposure tool 104 is depressurized from a vacuum to atmospheric pressure.

The exposure tool 104 may perform the cleaning operation for a particular time duration to achieve sufficient removal of contaminants from the mirrors 130a, 130b, 132a, and 132b. As an example, the gas inlets 136a, 136b, 142a, and 142b may provide the flows 302a, 302b, 302c, and 302d of the gas onto the mirrors 130a, 130b, 132a, and 132b, respectively, and the pumps 138 and 146 may remove the byproduct gasses 304a and 304b from the illuminator 124 and the projection optics box 126, respectively, for a time duration in a range of approximately 2 hours to approximately 5 hours to achieve sufficient removal of contaminants from the mirrors 130a, 130b, 132a, and 132b. However, other time durations are within the scope of the present disclosure.

In some implementations, a plurality of cleaning operations may be performed to achieve increased cleaning performance for removing contaminants from the mirrors 130a, 130b, 132a, and 132b. In these implementations, a combination of the gas inlets 136a, 136b, 142a, and 142b providing the flows 302a, 302b, 302c, and 302d of the gas onto the mirrors 130a, 130b, 132a, and 132b, respectively, and the pumps 138 and 146 removing the byproduct gasses 304a and 304b from the illuminator 124 and the projection optics box 126, respectively, may be performed for a plurality of consecutive cycles (e.g., 2 cycles, 4 cycles, and/or another quantity of cycles).

As indicated above, FIG. 3 is provided as an example. Other examples may differ from what is described with regard to FIG. 3.

Figure 4:
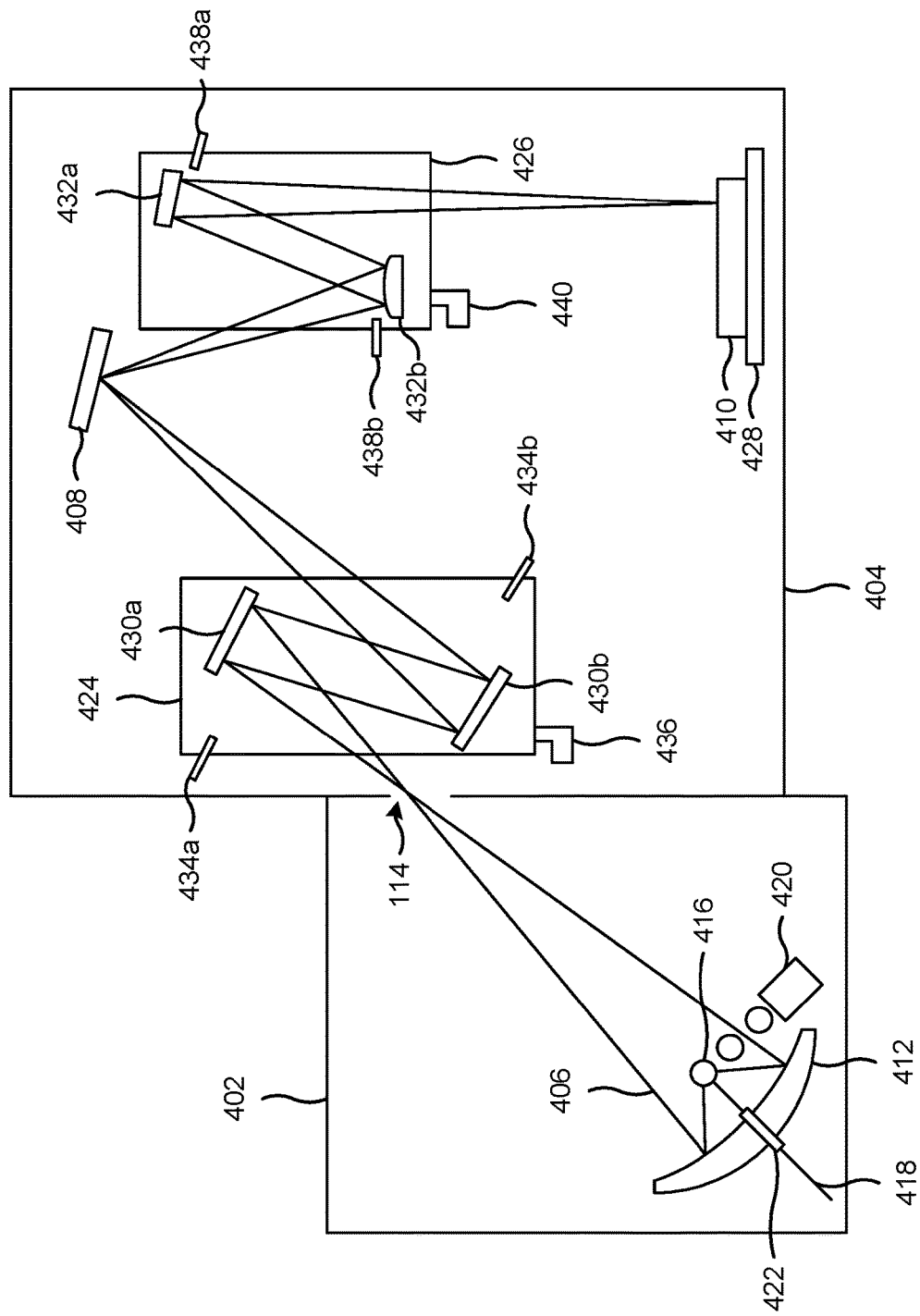
FIG. 4 is a diagram of an example lithography system described herein.

FIG. 4 is a diagram of an example lithography system 400 described herein. The lithography system 400 is similar to (and includes similar components to) the lithography system 100. However, instead of including separate gas inlets for providing a flow of a gas across the mirrors of the exposure tool 104 of the lithography system 100 and for cleaning the mirrors, the exposure tool 404 of the lithography system 400 includes gas inlets that are configured to perform dual purposes of providing a flow of a gas across the mirrors of the exposure tool of the lithography system 400 and for cleaning the mirrors. This may reduce the complexity of the lithography system 400 (and the exposure tool included in the lithography system 400). While FIG. 4 illustrates an alternative implementation to the lithography system 100, some implementations of a lithography system include a combination of separate gas inlets for providing a flow of a gas across a first mirror and for cleaning the first mirror and a single gas inlet for both providing a flow of a gas across a second mirror and for cleaning the second mirror.

As shown in FIG. 4, the illuminator 424 of the exposure tool 404 includes gas inlets 434a and 434b, as well as a pump 436. The gas inlet 434a is configured to provide a flow of a first gas across the mirror 430a (e.g., across the front of the mirror 430a) during an exposure operation of the lithography system 400. The gas inlet 434a is also configured to provide a flow of a second gas onto the front of the mirror 430a to clean or remove contaminants from the mirror 430a. Similarly, the gas inlet 434b is configured to provide a flow of the first gas across the mirror 430b (e.g., across the front of the mirror 430b) during an exposure operation of the lithography system 400, and is also configured to provide a flow of the second gas onto the front of the mirror 430b to clean or remove contaminants from the mirror 430b. The pump 436 is configured to pump, evacuate, and/or otherwise remove gas (e.g., the gasses provided by the gas inlets 434a and 434b, byproduct gasses) from the illuminator 424.

As further shown in FIG. 4, the projection optics box 426 of the exposure tool 404 includes gas inlets 438a and 438b, as well as a pump 440. The gas inlet 438a is configured to provide a flow of a first gas across the mirror 432a (e.g., across the front of the mirror 432a) during an exposure operation of the lithography system 400. The gas inlet 438a is also configured to provide a flow of a second gas onto the front of the mirror 432a to clean or remove contaminants from the mirror 432a. Similarly, the gas inlet 438b is configured to provide a flow of the first gas across the mirror 432b (e.g., across the front of the mirror 432b) during an exposure operation of the lithography system 400, and is also configured to provide a flow of the second gas onto the front of the mirror 432b to clean or remove contaminants from the mirror 432b. The pump 440 is configured to pump, evacuate, and/or otherwise remove gas (e.g., the gasses provided by the gas inlets 438a and 438b, byproduct gasses) from the projection optics box 426.

In some implementations, the gas inlets 434a, 434b, 438a, and 438b include articulating gas inlets that are capable of being pointed in a first direction (or are capable of being configured in a first orientation) to provide a flow of a gas across the mirrors 430a, 430b, 432a, and 432b, respectively, and are capable of being pointed in a second direction (or are capable of being configured in a second orientation) to provide a flow of a gas onto the mirrors 430a, 430b, 432a, and 432b, respectively. In some implementations, the gas inlets 434a, 434b, 438a, and 438b include nozzles that are capable of steering or directing flows of gasses in different directions. As an example, the nozzles of the gas inlets 434a, 434b, 438a, and 438b may be capable of steering or directing a flow of a gas in a first direction to provide a flow of a gas across the mirrors 430a, 430b, 432a, and 432b, respectively, and may be capable of steering or directing a flow of another gas in a second direction to provide a flow of a gas onto the mirrors 430a, 430b, 432a, and 432b, respectively.

As indicated above, FIG. 4 is provided as an example. Other examples may differ from what is described with regard to FIG. 4.

Figure 5:
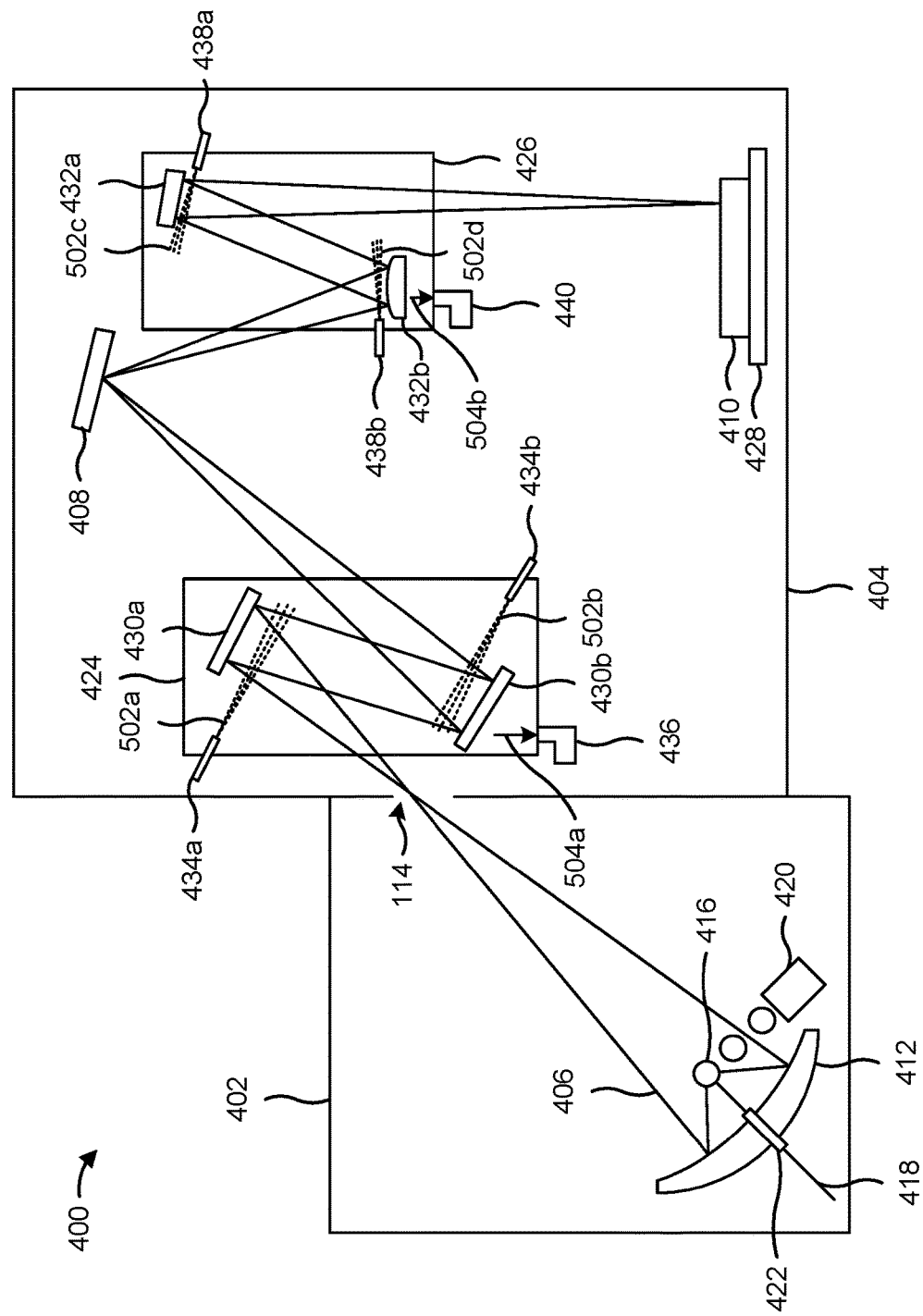
FIGS. 5 and 6 are diagrams of example implementations described herein.

FIG. 5 is a diagram of example implementation 500 described herein. The example implementation 500 includes an example exposure operation in which the lithography system 400 exposes the semiconductor substrate 410 on the stage 428 to the radiation 406 to transfer a pattern from the reticle 408 to the semiconductor substrate 410. Moreover, the example implementation 500 includes an example in which the gas inlets 434a, 434b, 438a, and 438b are used to provide a gas flow (e.g., a gas curtain or gas wall) across the front of the mirrors 430a, 430b, 432a, and 432b, respectively, to prevent, reduce, and/or otherwise reduce the likelihood of contaminants in the lithography system 400 from reaching (and causing a contaminant buildup on) the mirrors 430a, 430b, 432a, and 432b.

As shown in FIG. 5, the lithography system 400 performs an exposure operation to expose the semiconductor substrate 410 to the radiation 406 to transfer a patten from the reticle 408 to the semiconductor substrate 410. An example EUV exposure operation is described in connection with FIG. 1.

During the exposure operation, the gas inlet 434a is configured in a first configuration such that the gas inlet 434a provides a flow 502a of the first (e.g., hydrogen ($H_2$) or another suitable gas) gas into the illuminator 424 and across the mirror 430a (e.g., across the front of the mirror 130a). The gas inlet 434b is configured in a first configuration such that gas inlet 434b provides a flow 502b of the first gas into the illuminator 424 and across the mirror 430b (e.g., across the front of the mirror 430b). The gas inlet 438a is configured in a first configuration such that gas inlet 438a provides a flow 502c of the first gas into the projection optics box 426 and across the mirror 432a (e.g., across the front of the mirror 432a). The gas inlet 438b is configured in a first configuration such that gas inlet 438b provides a flow 502d of the first gas into the projection optics box 426 and across the mirror 432b (e.g., across the front of the mirror 432b).

The flows 502a, 502b, 502c, and 502d of the first gas collect contaminants such as carbon (C) and tin (Sn), among other examples, before the contaminants reach and/or land on the mirrors 430a, 430b, 432a, and 432b during the exposure operation. Byproduct gasses 504a and 504b (which may include a combination of the first gas and the contaminants collected by the first gas) are pumped out of and/or removed from the illuminator 424 and the projection optics box 426, respectively, and out of the exposure tool 104.

As indicated above, FIG. 5 is provided as an example. Other examples may differ from what is described with regard to FIG. 5.

Figure 6:
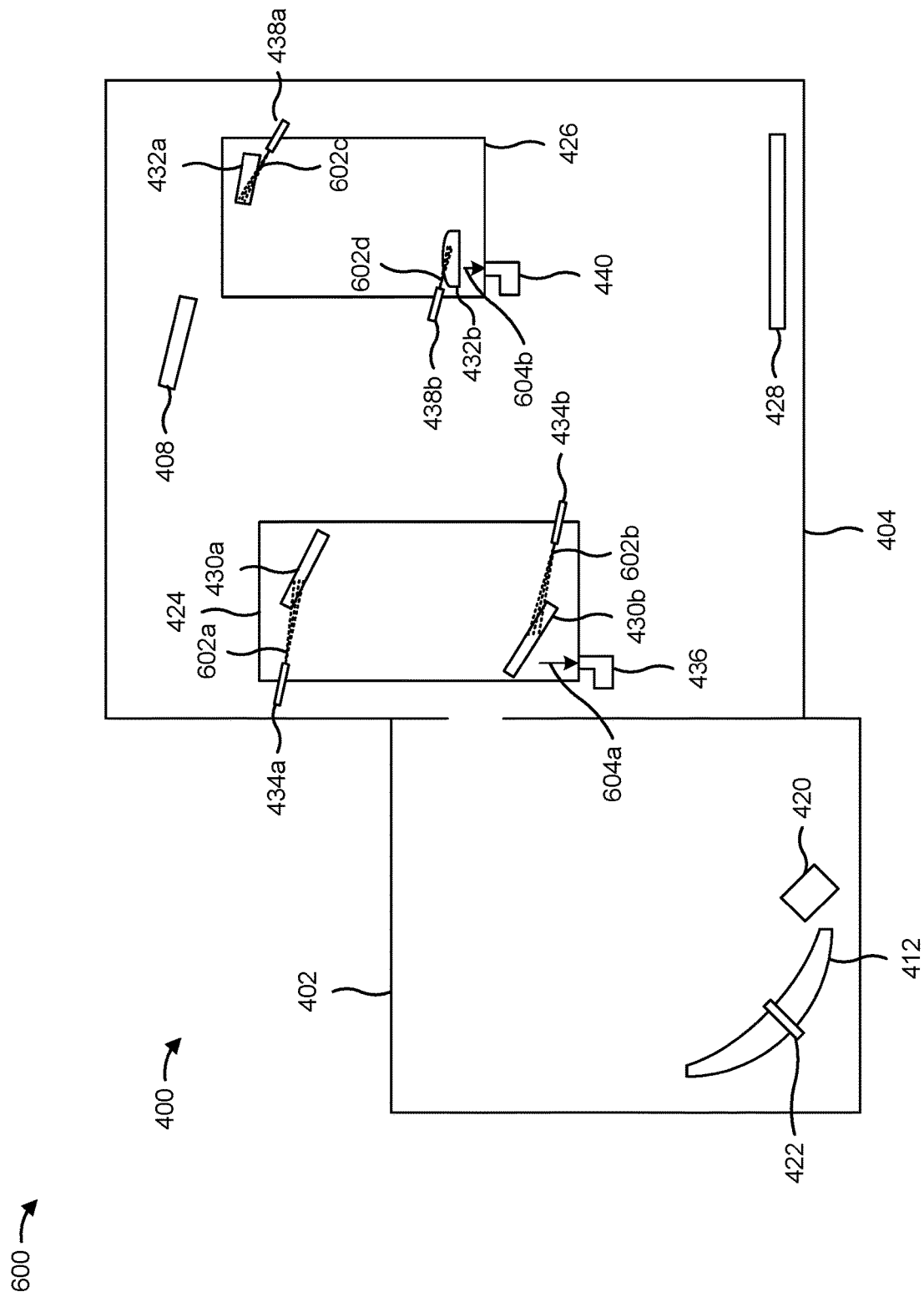

FIG. 6 is a diagram of an example implementation 600 described herein. The example implementation 600 includes an example cleaning operation in which optical components of the exposure tool 404 are cleaned while the lithography system 400 is offline, between exposure operations, and/or otherwise idle. While the lithography system 400 is not performing an exposure operation (e.g., during downtime of the lithography system 400, prior to an exposure operation, and/or after an exposure operation), the gas inlets 434a, 434b, 438a, and 438b are operated in a second configuration (e.g., different from the first configuration described in connection with FIG. 5) to clean and/or otherwise remove contaminants from the mirrors 430a, 430b, 432a, and 432b, respectively.

In the second configuration, the gas inlet 434a provides a flow 602a of a second gas (e.g., different from the first gas described in connection with FIG. 5 such as heated ozone ($O_3$), heated XCDA, and/or another gas) in the illuminator 424 onto the mirror 430a to clean contaminants from the mirror 430a. The gas inlet 434b provides a flow 602b of the second gas in the illuminator 424 onto the mirror 430b to clean contaminants from the mirror 430b. The gas inlet 438a provides a flow 602c of the second gas in the projection optics box 426 onto the mirror 432a to clean contaminants from the mirror 432a. The gas inlet 438b provides a flow 602d of the second gas in the projection optics box onto the mirror 432b to clean contaminants from the mirror 432b. The pump 436 removes byproduct gasses 604a, resulting from a reaction between the second gas and the contaminants (e.g., carbon contaminants) on the mirrors 430a and 430b, from the illuminator 424. The pump 440 removes byproduct gasses 604b, resulting from a reaction between the second gas and the contaminants (e.g., carbon contaminants) on the mirrors 432a and 432b, from the projection optics box 426. In some implementations, the pumps 436 and 440 remove the byproduct gasses 604a and 604b from the exposure tool 404.

As indicated above, FIG. 6 is provided as an example. Other examples may differ from what is described with regard to FIG. 6.

Figure 7:
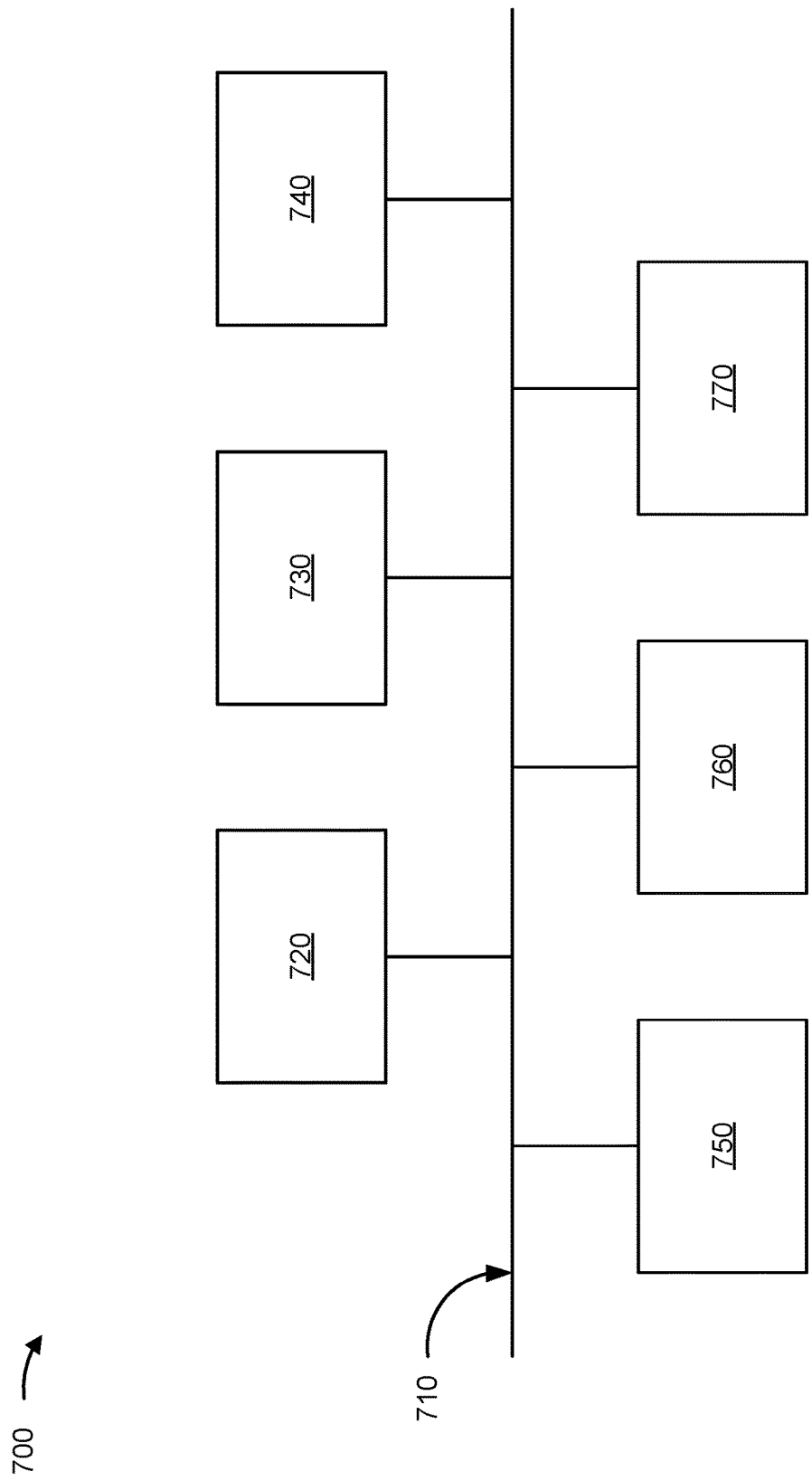
FIG. 7 is a diagram of example components of one or more devices of FIG. 1 described herein.

FIG. 7 is a diagram of example components of a device 700. In some implementations, the lithography system 100, the radiation source 102, the exposure tool 104, the lithography system 400, the radiation source 402, and/or the exposure tool 404 may include one or more devices 700 and/or one or more components of device 700. As shown in FIG. 7, device 700 may include a bus 710, a processor 720, a memory 730, a storage component 740, an input component 750, an output component 760, and a communication component 770.

Bus 710 includes a component that enables wired and/or wireless communication among the components of device 700. Processor 720 includes a central processing unit, a graphics processing unit, a microprocessor, a controller, a microcontroller, a digital signal processor, a field-programmable gate array, an application-specific integrated circuit, and/or another type of processing component. Processor 720 is implemented in hardware, firmware, or a combination of hardware and software. In some implementations, processor 720 includes one or more processors capable of being programmed to perform a function. Memory 730 includes a random access memory, a read only memory, and/or another type of memory (e.g., a flash memory, a magnetic memory, and/or an optical memory).

Storage component 740 stores information and/or software related to the operation of device 700. For example, storage component 740 may include a hard disk drive, a magnetic disk drive, an optical disk drive, a solid state disk drive, a compact disc, a digital versatile disc, and/or another type of non-transitory computer-readable medium. Input component 750 enables device 700 to receive input, such as user input and/or sensed inputs. For example, input component 750 may include a touch screen, a keyboard, a keypad, a mouse, a button, a microphone, a switch, a sensor, a global positioning system component, an accelerometer, a gyroscope, and/or an actuator. Output component 760 enables device 700 to provide output, such as via a display, a speaker, and/or one or more light-emitting diodes. Communication component 770 enables device 700 to communicate with other devices, such as via a wired connection and/or a wireless connection. For example, communication component 770 may include a receiver, a transmitter, a transceiver, a modem, a network interface card, and/or an antenna.

Device 700 may perform one or more processes described herein. For example, a non-transitory computer-readable medium (e.g., memory 730 and/or storage component 740) may store a set of instructions (e.g., one or more instructions, code, software code, and/or program code) for execution by processor 720. Processor 720 may execute the set of instructions to perform one or more processes described herein. In some implementations, execution of the set of instructions, by one or more processors 720, causes the one or more processors 720 and/or the device 700 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 7 are provided as an example. Device 700 may include additional components, fewer components, different components, or differently arranged components than those shown in FIG. 7. Additionally, or alternatively, a set of components (e.g., one or more components) of device 700 may perform one or more functions described as being performed by another set of components of device 700.

Figure 8:
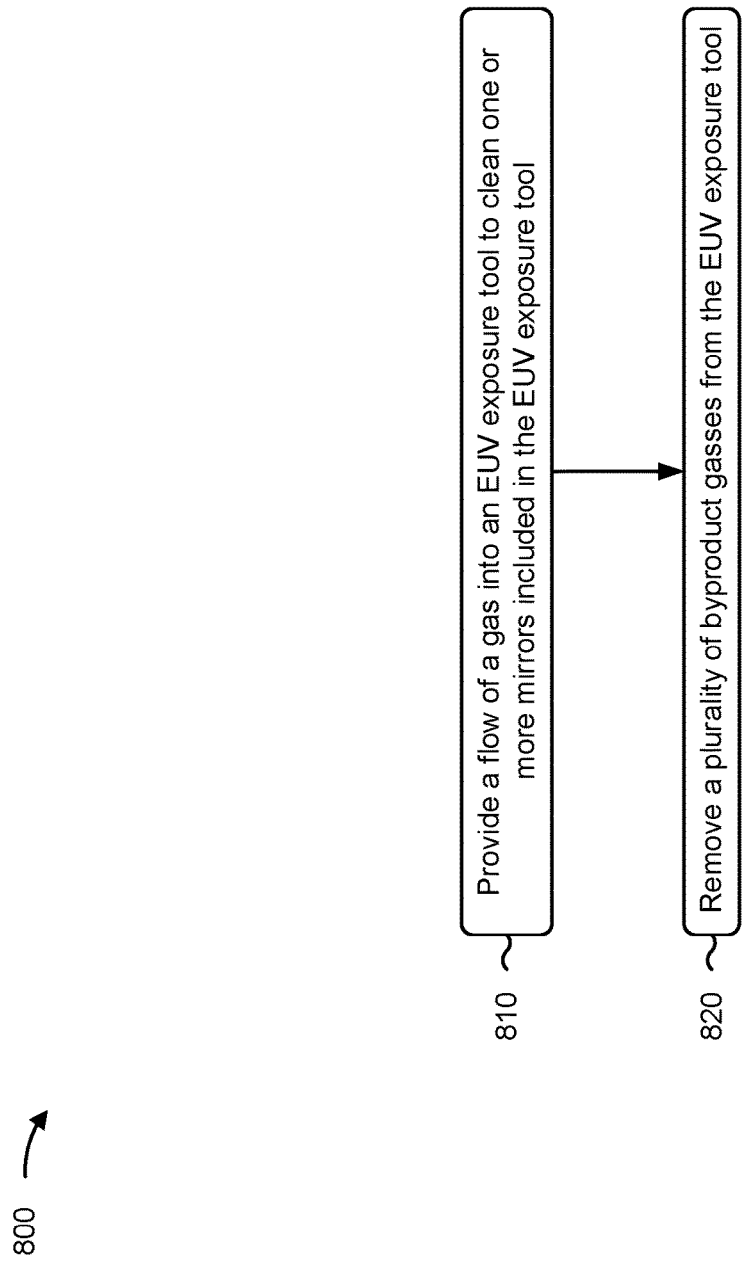
FIGS. 8 and 9 are flowcharts of example processes relating to operating a semiconductor processing tool described herein.

FIG. 8 is a flowchart of an example process 800 associated with operating a semiconductor processing tool. In some implementations, one or more process blocks of FIG. 8 may be performed by an EUV exposure tool (e.g., the exposure tool 104, the exposure tool 404). In some implementations, one or more process blocks of FIG. 8 may be performed by another device or a group of devices separate from or including the EUV exposure tool, such as a lithography system (e.g., the lithography system 100, the lithography system 400) and/or an EUV source (e.g., the radiation source 102, the radiation source 402), among other examples. Additionally, or alternatively, one or more process blocks of FIG. 8 may be performed by one or more components of device 700, such as processor 720, memory 730, storage component 740, input component 750, output component 760, and/or communication component 770.

As shown in FIG. 8, process 800 may include providing a flow of a gas into an EUV exposure tool to clean one or more mirrors included in the EUV exposure tool (block 810). For example, the exposure tool (e.g., the exposure tool 104 and/or 404) may provide a flow (e.g., the flow 302a, 302b, 302c, 302d, 602a, 602b, 602c, and/or 602d) of a gas into the exposure tool to clean one or more mirrors (e.g., the mirror 130a, 130b, 132a, 132b, 430a, 430b, 432a, 432b, 1010a, 1010b, 1016a, 1016b, 1016c, 1016d, 1016e, and/or 1016f) included in the exposure tool 104, as described herein. In some implementations, the gas reacts with contaminants on the one or more mirrors to form a plurality of byproduct gasses (e.g., the byproduct gas 304a, 304b, 604a, and/or 604b).

As further shown in FIG. 8, process 800 may include removing the plurality of byproduct gasses from the EUV exposure tool (block 820). For example, the exposure tool (e.g., the exposure tool 104 and/or 404) may remove the plurality of byproduct gasses (e.g., the byproduct gas 304a, 304b, 604a, and/or 604b) from the exposure tool, as described herein.

Process 800 may include additional implementations, such as any single implementation or any combination of implementations described below and/or in connection with one or more other processes described elsewhere herein.

In a first implementation, providing the flow of the gas and removing the plurality of the byproduct gasses include at least one of providing the flow of the gas and removing the plurality of the byproduct gasses prior to performing an exposure operation using the EUV exposure tool, or providing the flow of the gas and removing the plurality of the byproduct gasses after performing an exposure operation using the EUV exposure tool. In a second implementation, alone or in combination with the first implementation, providing the flow of the gas and removing the plurality of the byproduct gasses include performing a combination of providing the flow of the gas and removing the plurality of the byproduct gasses for a time duration in a range of approximately 2 hours to approximately 5 hours.

In a third implementation, alone or in combination with one or more of the first and second implementations, a temperature of the gas is in a range of approximately 50 degrees Celsius to approximately 90 degrees Celsius. In a fourth implementation, alone or in combination with one or more of the first through third implementations, the gas includes at least one of heated ozone ($O_3$), or heated extra clean dry air (XCDA).

In a fifth implementation, alone or in combination with one or more of the first through fourth implementations, the plurality of byproduct gasses include carbon dioxide ($CO_2$), and oxygen ($O_2$). In a sixth implementation, alone or in combination with one or more of the first through fifth implementations, removal of the contaminants from the one or more mirrors using the flow of the gas decreases reflectivity decay of the EUV exposure tool. In a seventh implementation, alone or in combination with one or more of the first through sixth implementations, providing the flow of the gas and removing the plurality of the byproduct gasses are performed for a plurality of consecutive cycles.

Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

Figure 9:
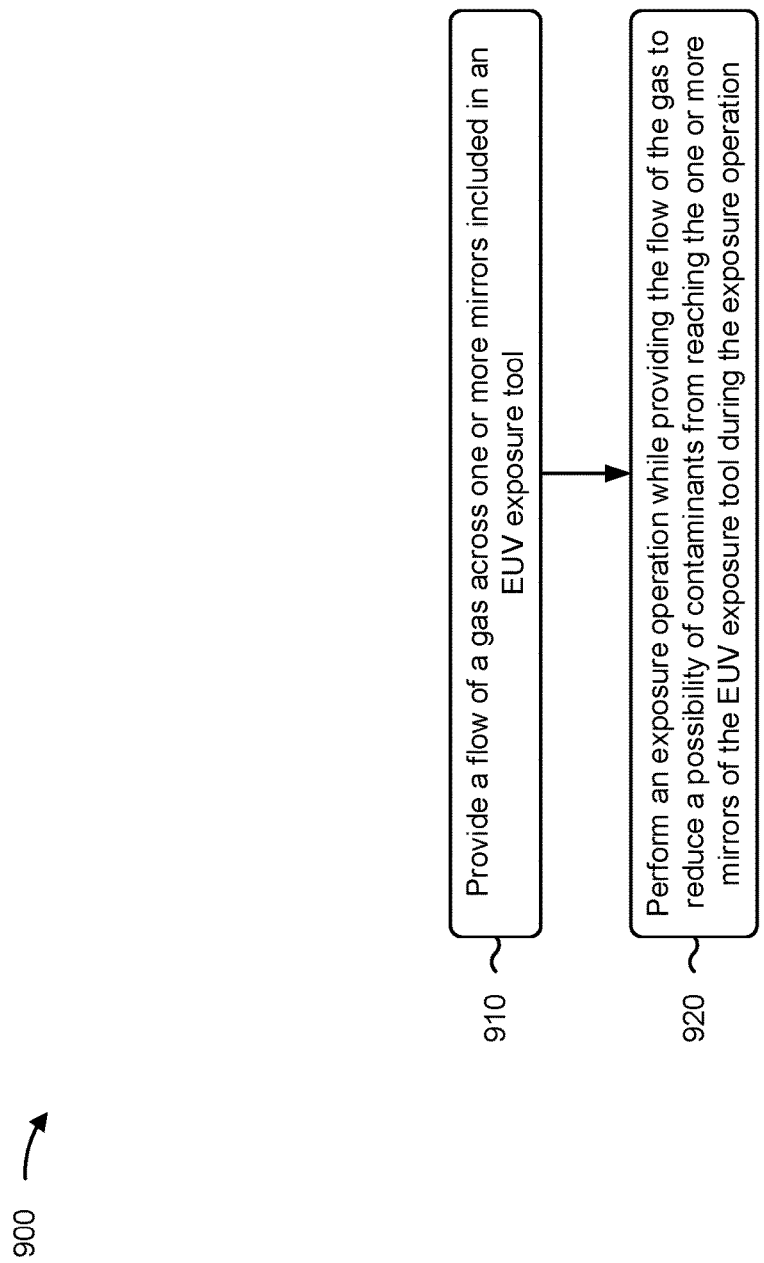

FIG. 9 is a flowchart of an example process 900 associated with operating a semiconductor processing tool. In some implementations, one or more process blocks of FIG. 9 may be performed by an EUV exposure tool (e.g., the exposure tool 104, the exposure tool 404). In some implementations, one or more process blocks of FIG. 9 may be performed by another device or a group of devices separate from or including the EUV exposure tool, such as a lithography system (e.g., the lithography system 100, the lithography system 400) and/or an EUV source (e.g., the radiation source 102, the radiation source 402), among other examples. Additionally, or alternatively, one or more process blocks of FIG. 9 may be performed by one or more components of device 700, such as processor 720, memory 730, storage component 740, input component 750, output component 760, and/or communication component 770.

As shown in FIG. 9, process 900 may include providing a flow of a gas across one or more mirrors included in an EUV exposure tool (block 910). For example, the exposure tool (e.g., the exposure tool 104 and/or 404) may provide a flow (e.g., the flow 202a, 202b, 202c, 202d, 502a, 502b, 502c, and/or 502d) of a gas across one or more mirrors (e.g., the mirror 130a, 130b, 132a, 132b, 430a, 430b, 432a, and/or 432b) included in the exposure tool, as described herein.

As further shown in FIG. 9, process 900 may include performing an exposure operation while providing the flow of the gas to reduce a possibility of contaminants from reaching the one or more mirrors of the EUV exposure tool during the exposure operation (block 920). For example, the exposure tool (e.g., the exposure tool 104 and/or 404) may perform an exposure operation while providing the flow (e.g., the flow 202a, 202b, 202c, 202d, 502a, 502b, 502c, and/or 502d) of the gas to reduce a possibility of contaminants from reaching the one or more mirrors (e.g., the mirror 130a, 130b, 132a, 132b, 430a, 430b, 432a, 432b, 1010a, 1010b, 1016a, 1016b, 1016c, 1016d, 1016e, and/or 1016f) of the exposure tool during the exposure operation, as described herein.

Process 900 may include additional implementations, such as any single implementation or any combination of implementations described below and/or in connection with one or more other processes described elsewhere herein.

In a first implementation, the contaminants include at least one of carbon (C), or tin (Sn). In a second implementation, alone or in combination with the first implementation, the gas includes hydrogen ($H_2$). In a third implementation, alone or in combination with one or more of the first and second implementations, providing the flow of the gas includes providing the flow of the gas in a flow rate range of approximately 10 SCCM to approximately 300 SCCM. In a fourth implementation, alone or in combination with one or more of the first through third implementations, providing the flow of the gas across the one or more mirrors includes at least one of providing the flow of the gas across one or more first mirrors included in an illuminator of the EUV exposure tool, or providing the flow of the gas across one or more second mirrors included in a POB of the EUV exposure tool.

Although FIG. 9 shows example blocks of process 900, in some implementations, process 900 may include additional blocks, fewer blocks, different blocks, or differently arranged blocks than those depicted in FIG. 9. Additionally, or alternatively, two or more of the blocks of process 900 may be performed in parallel.

Figure 10A:
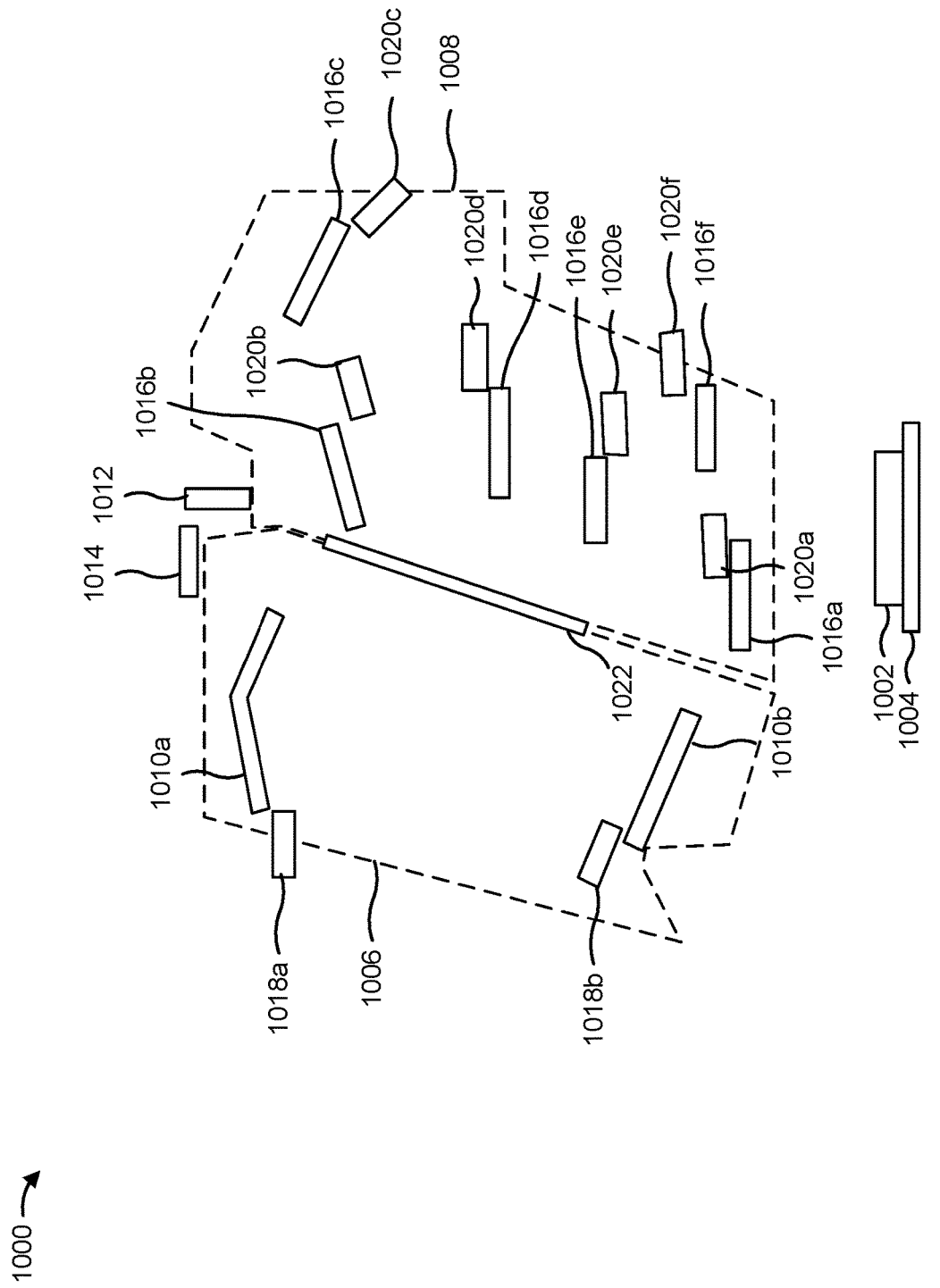
FIGS. 10A and 10B are diagrams of an example implementation described herein.
Figure 10B:
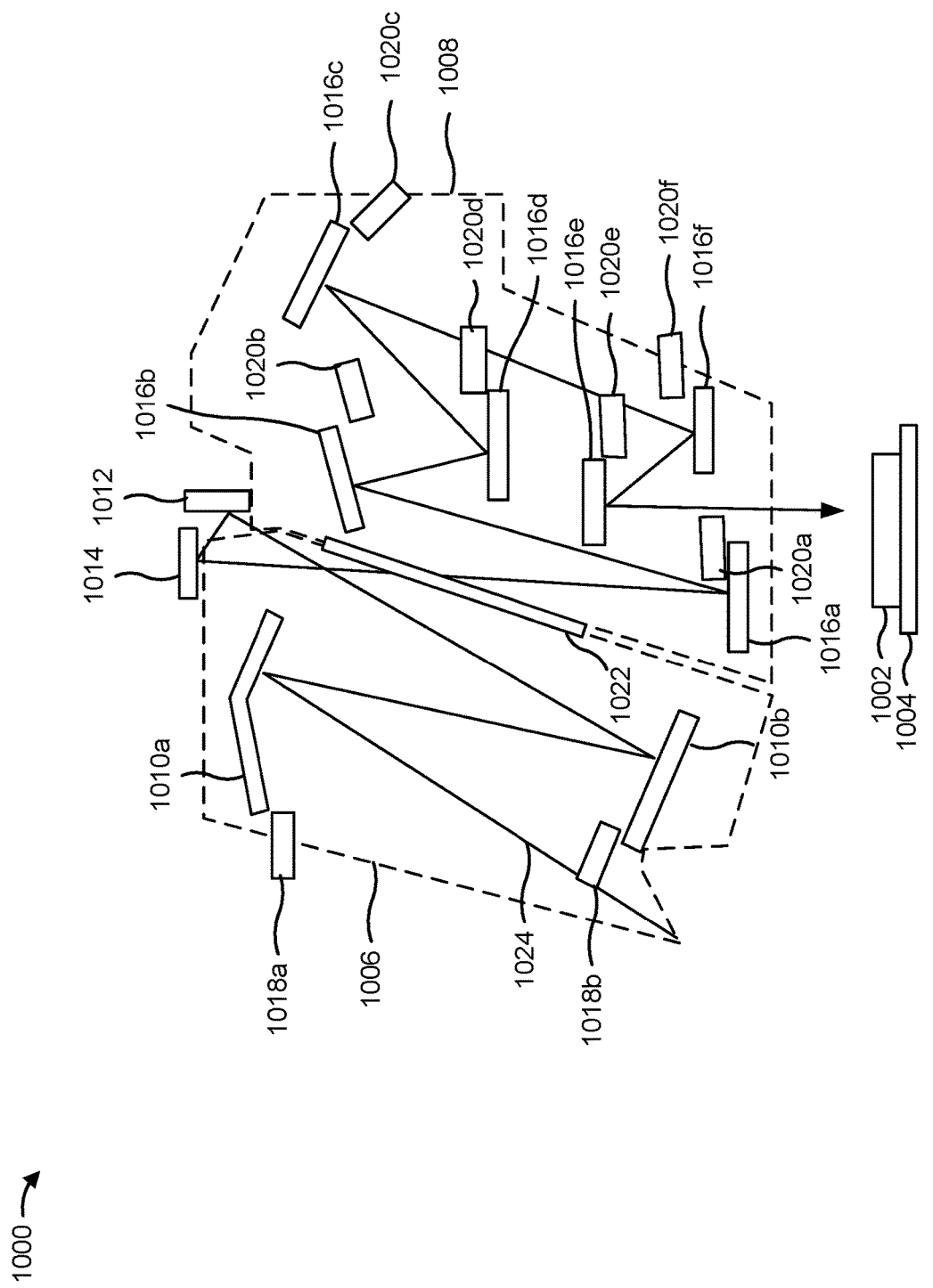

FIGS. 10A and 10B are diagrams of an example implementation 1000 described herein. The example implementation 1000 includes an example of an illuminator and a projection optics box, among other components, for use in an EUV exposure tool such as the exposure tool 104 and/or the exposure tool 404 described herein. The illuminator and a projection optics box may be included in the EUV exposure tool to expose a semiconductor substrate 1004 on a stage to EUV radiation.

As shown in FIG. 10A, the example implementation 1000 includes an illuminator 1006 and a projection optics box 1008. The illuminator 1006 includes a plurality of mirrors 1010a and 1010b (e.g., an FFM mirror, a PPM mirror), among other examples. Another mirror 1012 (e.g., a relay mirror) is included to direct EUV radiation from the illuminator 1006 onto a reticle 1014. The projection optics box 1008 includes a plurality of mirrors such as mirrors 1016a, 1016b, 1016c, 1016e, and 1016f, among other examples.

As further shown in FIG. 10A, the illuminator 1006 includes a plurality of gas inlets 1018a and 1018b configured to clean the mirrors 1010a and 1010b and to provide a gas wall or curtain across the mirrors 1010a and 1010b to reduce and/or prevent contamination of the mirrors 1010a and 1010b. In some implementations, the illuminator 1006 includes a gas inlet for each mirror included in the illuminator 1006. In some implementations, the illuminator 1006 includes a greater quantity of gas inlets than mirrors included in the illuminator 1006.

As further shown in FIG. 10A, the projection optics box 1008 includes a plurality of gas inlets 1020a, 1020b, 1020c, 1020d, 1020e, and 1020f configured to clean the mirrors 1016a, 1016b, 1016c, 1016e, and 1016f and to provide a gas wall or curtain across the mirrors 1016a, 1016b, 1016c, 1016e, and 1016f to reduce and/or prevent contamination of the mirrors 1016a, 1016b, 1016c, 1016e, and 1016f. In some implementations, the projection optics box 1008 includes a gas inlet for each mirror included in the projection optics box 1008. In some implementations, the projection optics box 1008 includes a greater quantity of gas inlets than mirrors included in the projection optics box 1008.

As further shown in FIG. 10A, an exhaust 1022 is included between the illuminator 1006 and the projection optics box 1008 and is shared by the illuminator 1006 and the projection optics box 1008. The exhaust 1022 is configured to pump or remove byproduct gasses from the illuminator 1006 and the projection optics box 1008.

As shown in FIG. 10B, EUV radiation 1024 is provided into the illuminator 1006, which illuminates the reticle 1014 from the mirror 1012. After the pattern of the reticle 1014 is transferred to the EUV radiation 1024, the EUV radiation 1024 is provided into the projection optics box 1008, where the EUV radiation 1024 is focused onto the semiconductor substrate 1002.

As indicated above, FIGS. 10A and 10B are provided as an example. Other examples may differ from what is described with regard to FIGS. 10A and 10B.

In this way, an exposure tool (such as an EUV exposure tool or another type of semiconductor exposure tool) is configured to remove contaminants and/or prevent contamination of mirrors and/or other optical components included in the exposure tool. In some implementations, the exposure tool is configured to flush and/or otherwise remove contaminants from an illuminator, a projection optics box, and/or one or more other subsystems of the exposure tool using a heated gas such as ozone ($O_3$) or extra clean dry air (XCDA), among other examples. In some implementations, the exposure tool is configured to provide a gas curtain (or gas wall) that includes hydrogen ($H_2$) or another type of gas to reduce the likelihood of contaminants reaching the mirrors included in the exposure tool. In this way, the mirrors and one or more other components of the exposure tool are cleaned and maintained in a clean environment in which radiation (e.g., EUV radiation or another type of electromagnetic radiation) absorbing contaminants are controlled to increase the performance of the exposure tool.

As described in greater detail above, some implementations described herein provide a method. The method includes providing a flow of a gas into an EUV exposure tool to clean one or more mirrors included in the EUV exposure tool, where the gas reacts with contaminants on the one or more mirrors to form a plurality of byproduct gasses. The method includes removing the plurality of byproduct gasses from the EUV exposure tool.

As described in greater detail above, some implementations described herein provide a method. The method includes providing a flow of a gas across one or more mirrors included in an EUV exposure tool. The method includes performing an exposure operation while providing the flow of the gas to reduce a possibility of contaminants from reaching the one or more mirrors of the EUV exposure tool during the exposure operation.

As described in greater detail above, some implementations described herein provide an EUV exposure tool. The EUV exposure tool includes one or more mirrors. The EUV exposure tool includes one or more first gas inlets configured to provide a first gas onto the one or more mirrors to remove carbon from the one or more mirrors. The an EUV exposure tool includes one or more second gas inlets configured to provide a second gas across a front of the one or more mirrors to block at least one of carbon or tin from landing on the one or more mirrors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a flow of a gas into an extreme ultraviolet (EUV) exposure tool to clean one or more mirrors included in the EUV exposure tool,
   wherein the gas reacts with contaminants on the one or more mirrors to form a plurality of byproduct gasses; and removing the plurality of byproduct gasses from the EUV exposure tool,
wherein a combination of providing the flow of the gas and removing the plurality of the byproduct gasses is performed for a time duration in a range of approximately 2 hours to approximately 5 hours.

2. The method of claim 1, wherein providing the flow of the gas and removing the plurality of the byproduct gasses comprise at least one of:
providing the flow of the gas and removing the plurality of the byproduct gasses prior to performing an exposure operation using the EUV exposure tool, or
providing the flow of the gas and removing the plurality of the byproduct gasses after performing an exposure operation using the EUV exposure tool.

3. The method of claim 1, wherein a temperature of the gas is in a range of approximately 50 degrees Celsius to approximately 90 degrees Celsius.

4. The method of claim 1, wherein the gas comprises at least one of:
ozone ($O_3$), or
heated extra clean dry air (XCDA).

5. The method of claim 1, wherein the plurality of byproduct gasses include:
carbon dioxide ($CO_2$); and
oxygen ($O_2$).

6. The method of claim 1, wherein removal of the contaminants from the one or more mirrors using the flow of the gas decreases reflectivity decay of the EUV exposure tool.

7. The method of claim 1, wherein providing the flow of the gas and removing the plurality of the byproduct gasses are performed for a plurality of consecutive cycles.

8. A method, comprising:
providing, at a flow rate range of approximately 10 standard cubic centimeters per minute (SCCM) to approximately 300 SCCM, a flow of a gas across one or more mirrors included in an extreme ultraviolet (EUV) exposure tool,
wherein the gas reacts with contaminants on the one or more mirrors to form a plurality of byproduct gasses; and
removing the plurality of byproduct gasses from the EUV exposure tool.

9. The method of claim 8, wherein the contaminants include at least one of:
carbon (C), or
tin (Sn).

10. The method of claim 8, wherein the gas includes hydrogen ($H_2$).

11. The method of claim 8, wherein providing the flow of the gas across the one or more mirrors comprises at least one of:
providing the flow of the gas across one or more first mirrors included in an illuminator of the EUV exposure tool, or
providing the flow of the gas across one or more second mirrors included in a projection optics box (POB) of the EUV exposure tool.

12. The method of claim 8, wherein providing the flow of the gas and removing the plurality of the byproduct gasses comprise:
providing the flow of the gas and removing the plurality of the byproduct gasses prior to performing an exposure operation using the EUV exposure tool.

13. The method of claim 8, wherein providing the flow of the gas and removing the plurality of the byproduct gasses comprise:
providing the flow of the gas and removing the plurality of the byproduct gasses after performing an exposure operation using the EUV exposure tool.

14. The method of claim 8, wherein removal of the contaminants from the one or more mirrors using the flow of the gas decreases reflectivity decay of the EUV exposure tool.

15. A method, comprising:
providing, during an exposure operation, a flow of a gas into an extreme ultraviolet (EUV) exposure tool to remove one or more contaminants, wherein the flow of gas reacts with the one or more contaminants to form one or more byproduct gasses, wherein a temperature of the gas is in a range of approximately 50 degrees Celsius to approximately 90 degrees Celsius; and
removing the one or more byproduct gasses in the EUV exposure tool.

16. The method of claim 15, wherein providing the flow of the gas and removing the one or more byproduct gasses comprise at least one of:
providing the flow of the gas and removing the one or more byproduct gasses prior to performing an exposure operation using the EUV exposure tool, or
providing the flow of the gas and removing the one or more byproduct gasses after performing an exposure operation using the EUV exposure tool.

17. The method of claim 15, wherein providing the flow of the gas and removing the one or more byproduct gasses comprise:
performing a combination of providing the flow of the gas and removing the one or more byproduct gasses for a time duration in a range of approximately 2 hours to approximately 5 hours.

18. The method of claim 15, wherein the gas comprises at least one of:
ozone ($O_3$), or
heated extra clean dry air (XCDA).

19. The method of claim 15, wherein the one or more byproduct gasses include one or more of:
carbon dioxide ($CO_2$); or
oxygen ($O_2$).

20. The method of claim 15, wherein removal of the one or more contaminants decreases reflectivity decay of the EUV exposure tool.

* * * * *